United States Patent [19]

Kim

[11] Patent Number: 5,438,540
[45] Date of Patent: Aug. 1, 1995

[54] SEMICONDUCTOR SRAM MEMORY DEVICE

[75] Inventor: Han-soo Kim, Suwon-city, Rep. of Korea

[73] Assignee: Samsung Electronics Co., Ltd., Suwon-City, Rep. of Korea

[21] Appl. No.: 153,927

[22] Filed: Nov. 18, 1993

[30] Foreign Application Priority Data

Nov. 18, 1992 [KR] Rep. of Korea ................... 92-21651

[51] Int. Cl.[6] ........................................ H01L 21/335
[52] U.S. Cl. ................... 365/174; 365/182; 257/66; 437/41
[58] Field of Search ............. 365/174, 182, 185; 437/41, 40, 42; 257/66

[56] References Cited

U.S. PATENT DOCUMENTS

| | | | |
|---|---|---|---|
| 5,156,987 | 10/1992 | Sandhu et al. | 437/40 |
| 5,198,379 | 3/1993 | Adan | 437/41 |
| 5,281,828 | 1/1994 | Muragishi | 257/66 |

*Primary Examiner*—Viet Q. Nguyen
*Attorney, Agent, or Firm*—Charles R. Donohoe; Robert A. Westerlund, Jr.; Stephen R. Whitt

[57] ABSTRACT

A semiconductor SRAM device is provided wherein the electrical characteristics of the memory cell of the SRAM device is enhanced by decreasing the OFF-current and by increasing ON-current of PMOS thin film transistor (TFT) load elements. An offset region is formed between the drain and channel regions of the PMOS TFT. The gate is formed below (or above) the channel region of the PMOS TFT, and an insulating layer is formed below the gate. A ground potential $V_{ss}$ conductive layer is formed below the insulating layer, facing the offset region, to thereby operate as a gate for the offset region. The ground potential of the conductive layer facing the offset region of the PMOS TFT is constantly ON because of the gate operation of the ground potential conductive layer. A higher ON/OFF current ratio results, and the electric characteristics of the PMOS TFT load elements and therefore the SRAM device are thereby enhanced.

16 Claims, 3 Drawing Sheets

SEMICONDUCTOR SRAM MEMORY DEVICE

FIELD OF THE INVENTION

The present invention relates to a semiconductor memory device, and more particularly, to a static random access memory (SRAM) device having an offset region formed between the gate and drain regions of the PMOS thin film transistor (TFT) load elements of the memory cell.

BACKGROUND OF THE INVENTION

In general, an SRAM semiconductor memory device is faster and easier to use than a Dynamic Random Access Memory (DRAM) device. Because of this, SRAM devices are widely used in applications requiring small and medium sized memory capacity.

The memory cell of a conventional SRAM device consists of two flip-flop circuits consisting of two transmission transistors, two driving transistors, and two load elements. The memory information is preserved as a voltage difference between the input and output terminals of the flip-flops as an accumulated charge. The charge is constantly maintained by a continuous power source applied through the load elements, so a refresh function which is required in a DRAM device is unnecessary in an SRAM device.

The conventional SRAM device comprises either a MOS transistor or a resistor as the load elements. In some instances a depletion type NMOS transistor is used as the load element. However, because it consumes a relatively large amount of power it is not often used in the memory cells of SRAM devices.

Often used for the load elements is an easily made layer of high resistance polycrystalline silicon. The polycrystalline silicon layer consumes a lower amount of power and is therefore conventionally preferred as a load element over NMOS transistors. However, the use of the polycrystalline layer reduces the production yield of the SRAM devices because as the designs of SRAM devices create larger memory capacity, the difference between the current through the load element of a memory cell and the leakage current in the node decreases. The decrease in this ratio of currents degrades the memory retention in the memory cell.

In SRAM devices constructed using CMOS technology, PMOS thin film transistors are used as load elements to reduce this problem, however the problem still exists. The preferred CMOS SRAM devices with PMOS TFT load elements have a low leakage current when in the OFF-state ($V_{ds}=-5$ V, $V_{gs}=0$ V) to result in a low standby current, and have a high ON/OFF current ratio to improve the memory retention in the memory cell. The better these characteristics in the SRAM device, the more the SRAM device can be integrated for a larger memory capacity.

An SRAM device having a TFT load element with an offset region formed between the gate and drain regions is proposed in a paper entitled "A 0.1-$\mu$A Standby Current, Ground-Bounce-Immune 1-Mbit CMOS SRAM" by Manabu Ando, et al., IEEE SC-24, P1708, 1989. According to the Ando paper, the OFF-current of a TFT results from the leakage current of the p-n junction in the drain region. The OFF-current increases as the electric field between the gate and drain regions increases. Therefore, an offset region is formed in the drain region to decrease the electric field between the gate and drain regions. As a result, the OFF-current of the TFT is decreased. The Ando paper also discusses the characteristics of the ON/OFF current in relation to the length of the offset region.

The hot carrier effect in a PMOS TFT load element having an offset structure between the gate and drain regions is reported in a paper entitled "Hot-Carrier Induced Ion/Ioff Improvement of Offset PMOS TFT" by Hiroshi Furuta, et al., 1991, published in the "Symposium on VLSI Technology" at page 27. The Furuta paper proposes the formation of a PMOS TFT load element having an offset region doped with boron using a photo mask.

The attached FIG. 1 is a schematic view of the structure disclosed in Furuta. A gate electrode 12 and source and drain pad electrodes 13 for source and drain regions are formed a predetermined distance from the gate electrode 12 on an insulating layer 11 by depositing and patterning polycrystalline silicon. A gate oxide film 14 is then formed over the gate electrode 12 and the source and drain pad electrodes 13 to form an insulating layer.

A silicon layer is then deposited over the entire resultant surface of the gate oxide film 14 and exposed source and drain electrode pads 13. A channel region 15 is formed in the silicon layer by doping a phosphorus ion using a photo mask. The source 18 and drain regions 16 are formed by doping a $BF_2$ ion at the ends of the channel region 15. An offset region X is formed in the silicon layer between the channel region 15 and the drain region 16 by a doped boron ion using a photo mask.

An insulating layer 17 is then formed over the entire resultant surface of the silicon layer.

If the offset region X is formed in a PMOS TFT by a doped P$^-$ type impurity, the electric field around the drain junction relaxes and the resistance of the offset region X decreases. As a result, the OFF-current of the TFT is decreased and the ON-current of the TFT is increased.

However, the conventional structure of the memory cell of an SRAM device forces the offset region X of the PMOS TFT to be located on an arbitrary layer which has an electrical potential rather than on a ground potential layer. Therefore, an insulating film must be formed between the offset region X and the arbitrary layer, resulting in an unstable device. The conventional structure also results in a design of an SRAM device in which it is difficult to decrease the OFF-current and difficult to raise the ON-current. In addition, the formation of an offset region X by a doped P type impurity requires the use of an additional photo mask. Further, the effect of the offset region X is reduced by the electrical potential of the layer beneath the offset region X.

SUMMARY OF THE INVENTION

It is an object of the present invention to provide a semiconductor memory device which optimizes the layout of the memory cell of an SRAM device having PMOS thin film transistors as load elements. The present invention provides an SRAM device having the desirable characteristics of reduced OFF-current due to the load elements and increased ON-current.

To accomplish the above and other objects, there is provided a semiconductor SRAM device having PMOS TFT as load elements and having an offset region formed between the drain and the channel regions of the PMOS TFT load elements.

A ground wire of the memory cell is formed to face the offset region, with an insulating layer formed between the ground wire and the offset region. The ground wire operates as a gate for the offset region of the PMOS TFT load elements. The ground wire, acting as a gate for the offset region, maintains the offset region in a continuously ON-state, thereby reducing the resistance of the offset region. As a result, the characteristics of the memory cell of the SRAM device are enhanced because of the increased ON-current when the PMOS TFT is turned ON. In addition, since the P$^-$ offset region of the PMOS TMT is ON at all times, the strength of the electric field in the offset region is weakened when the PMOS TFT is OFF, thereby reducing the OFF-current.

BRIEF DESCRIPTION OF THE DRAWINGS

The above objects and other advantages of the present invention will become more apparent from the detailed description of a preferred embodiment thereof with reference to the attached drawings, in which.

DESCRIPTION OF THE PREFERRED EMBODIMENTS

Figure 1:
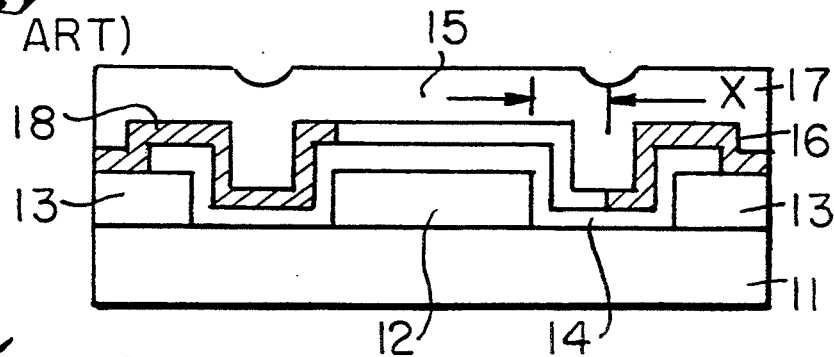
FIG. 1 is a schematic view showing a PMOS thin film transistor in a conventional SRAM device.
Figure 2:
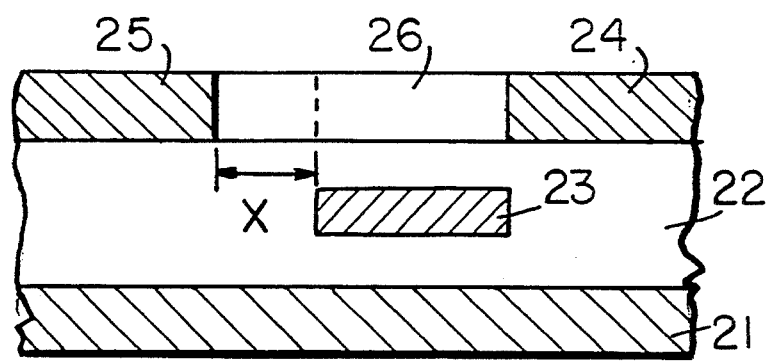
FIG. 2 is a schematic view showing a PMOS thin film transistor in the semiconductor SRAM device according to the present invention.

Referring now to the drawings, and particularly to FIG. 2, PMOS thin film transistors as load elements in a memory cell of an SRAM device are formed according to the present invention. FIG. 2 depicts a gate 23 formed in an insulating layer 22. A conduction layer is formed on the insulating layer 22. A source region 24 and a drain region 25 are formed in the conduction layer. A channel region 26 is formed in the conduction layer offset from the gate 23. An offset region X is formed in the channel region 26 having a predetermined length X measured by the distance between the drain region 25 and the gate 23.

A conductive layer of a ground wire 21 of the memory cell is formed below the insulating layer 22 facing the P$^-$ offset region X. The ground wire 21 operates as a gate for the offset region X of the PMOS thin film transistor, causing the offset region X to be constantly turned ON, which thereby reduces the resistance of the offset region X. The ON-current in the offset region X increases when the PMOS thin film transistor is turned ON. This increase in the ON-current of the PMOS TFT improves the ON/OFF ratio of the current, and therefore the memory retention of the SRAM device, even if the OFF-current of the PMOS thin film transistor remains unchanged. The formation of the ground wire 21 below the offset region X of the PMOS thin film transistor results in an optimum layout of the memory cell.

The drain region 25 of the PMOS thin film transistor is doped into a P$^+$ state. The electric field around the drain junction of the PMOS thin film transistor relaxes because the density gradient between the drain region 25 and the offset region X is slow. As a result, the OFF-current also decreases when the PMOS thin film transistor is turned OFF, which also enhances the electrical characteristics of the memory cell. Further, the doping level of the offset region X in the preferred embodiment of the present invention is controlled to be the same as that of the channel region 26. It is also preferred to have an appropriate difference in the doping levels of the channel region 26 and the drain region 25 doped into a P$^+$ state.

The gate 23 and the ground wire 21 both operate as bottom gates for the offset region X. The preferred structure is one in which the ground wire 21 and the gate 23 are formed in the same direction in relation to the conduction layer in general and the channel region 26 in particular. However, it is of course possible to structure the gate and ground wire of the PMOS TFT to have a top gate structure. It is additionally possible for the gate and ground wire to be formed in opposite directions to one another.

Figure 3:
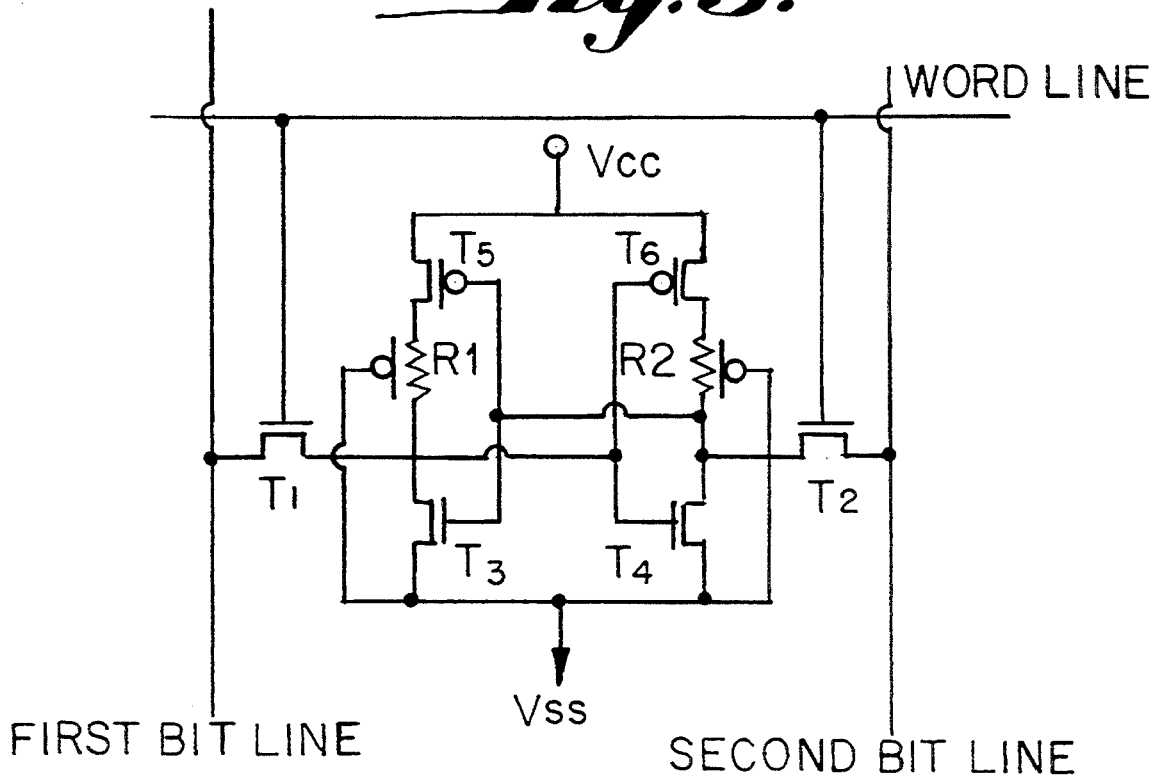
FIG. 3 is an equivalent circuit diagram of a semiconductor SRAM device according to the present invention.

FIG. 3 is a schematic representation of an equivalent circuit to the semiconductor SRAM device according to the present invention wherein PMOS thin film transistors are used as load elements. The SRAM cell comprises two NMOS transmission transistors $T_1$ and $T_2$, two NMOS driving transistors $T_3$ and $T_4$, and two load element PMOS thin film transistors $T_5$ and $T_6$. A first NMOS inverter is formed by the first NMOS transmission transistor $T_1$ and the first NMOS driving transistor $T_3$, and a second NMOS inverter is formed by the second NMOS transmission transistor $T_2$ and a second NMOS driving transistor $T_4$. A first CMOS inverter is formed by the first PMOS TFT $T_5$ and the first NMOS driving transistor $T_3$, while a second CMOS inverter is formed by the second PMOS TFT $T_6$ and the second NMOS driving transistor $T_4$. The first and second NMOS inverters form a first flip-flop, while the first and second CMOS inverters form a second flip-flop.

The first NMOS transmission transistor $T_1$ has a gate connected to a word line and a drain connected to a first bit line. The second NMOS transmission transistor $T_2$ has a gate connected to the word line and a drain connected to a second bit line.

The first NMOS driving transistor $T_3$ has a gate connected to the source of the second transmission transistor $T_2$ and a source grounded to $V_{ss}$, while the second NMOS driving transistor $T_4$ has a drain connected to the source of the second transmission transistor $T_2$, a source grounded to $V_{ss}$, and a gate connected to the source of the first transmission transistor $T_1$.

The first PMOS thin film transistor $T_5$ has a drain connected to the drain of the first driving transistor $T_3$, a source connected to a predetermined power source $V_{cc}$, and a gate connected to the gate of the first driving transistor $T_3$, the source of the second transmission transistor $T_2$ and the drain of the second driving transistor $T_4$. The second PMOS thin film transistor $T_6$ has a drain connected to the drain of the second driving transistor $T_4$, a source connected to the power source $V_{cc}$, and a gate connected to the gate of the second driving transistor $T_4$ add the source of the first transmission transistor $T_1$.

The references R1 and R2 in FIG. 3 respectively indicate offset regions X in the first and second PMOS thin film transistors $T_5$ and $T_6$. The ground wire of the memory cell is at potential $V_{ss}$ and operates as a gate for the offset regions X of the PMOS thin film transistors $T_5$ and $T_6$, therefore the offset regions X are always turned ON.

Figure 4:
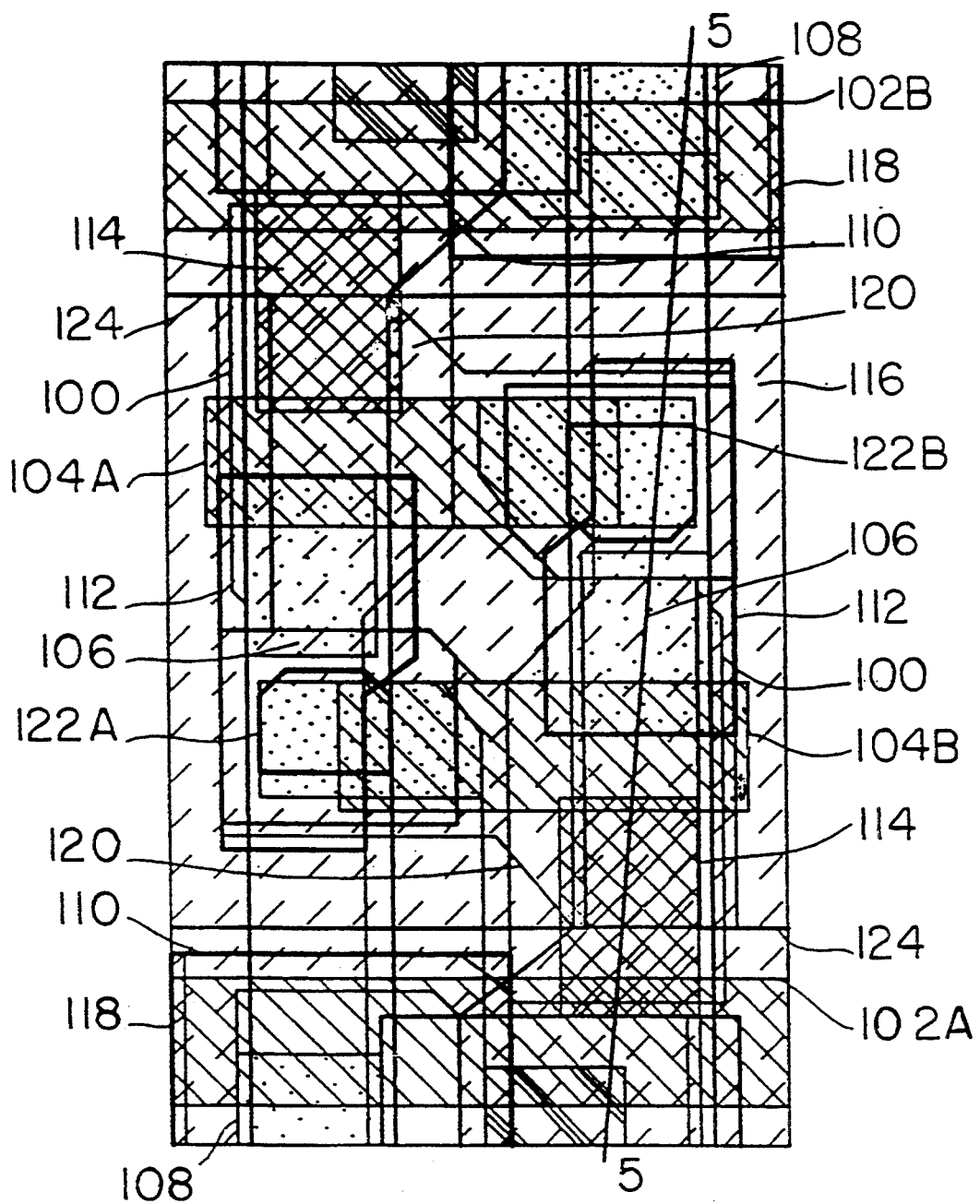
FIG. 4 is a layout diagram showing an embodiment of a semiconductor SRAM device according to the present invention.

An embodiment of a memory cell of an SRAM device according to the present invention is shown in FIG. 4. Two bar-shaped activation regions 100 are formed in one memory cell. In relation to the memory cell as shown in FIG. 4, the first activation region 100 is symmetrically connected to an upper memory cell and the second activation region 100 is symmetrically connected to a lower memory cell.

First conduction layer patterns 102A and 102B for forming the word lines and the gates of the first and second transmission transistors $T_1$ and $T_2$ are disposed in the upper and lower portions of the memory cell, respectively, as depicted in FIG. 4.

The gates 104A and 104B of the first and the second driving transistors $T_3$ and $T_4$ are formed to be parallel to each other and inside of the first conduction layer patterns 102A and 102B. First contact hole regions 106 are then formed for contacting the flip-flop of the first and second NMOS inverters. Second contact hole regions 108 are formed for contacting the first and second bit lines, which are formed at the top and bottom regions of the memory cell as depicted in FIG. 4.

A second conduction layer comprising first and second pads 112 and 110 are formed on the first and second contact hole regions 106 and 108, respectively. Third contact hole regions 114 are then formed for the driving transistors $T_3$ and $T_4$ to contact the ground wire at $V_{cc}$ potential.

A third conduction layer comprising the ground wire 116 is formed on the entire resultant surface of the memory cell. It is preferred to form the ground wire 116 using a conduction layer consisting of tungsten polycide (polysilicon+$WSi_x$) or tungsten silicide ($WSi_x$).

A fourth conduction layer comprising third pads 118 for forming a first bit line is formed in the upper and lower portions of the memory cell, respectively as depicted in FIG. 4. The fourth conduction layer also comprises the gates 120 of the first and second PMOS thin film transistors $T_5$ and $T_6$, which are disposed parallel to the word line. Fourth contact hole regions 122A and 122B are then formed.

A fifth conduction layer comprising power source lines 124 is formed respectively in the upper and lower portions of the memory cell as depicted in FIG. 4. The power source lines 124 are disposed parallel to the word line. The channel and drain regions of the first and the second PMOS thin film transistors $T_5$ and $T_6$ are also formed in the fifth conduction layer.

Figure 5:
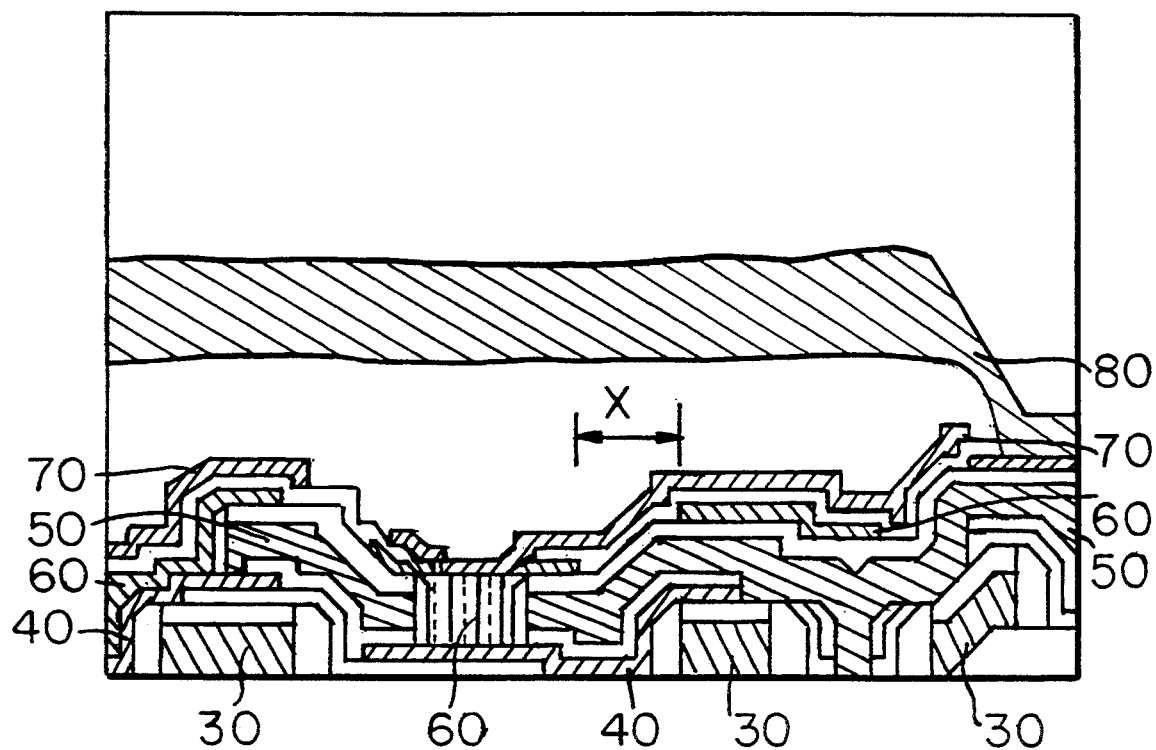
FIG. 5 is a cross-sectional view showing a semiconductor SRAM device according to the present invention taken along line A—A' of FIG. 4.

FIG. 5 is a cross-sectional view showing a semiconductor SRAM device according to the present invention taken along line A—A' of FIG. 4. The first conduction layer 30 is formed on a semiconductor substrate. The first conduction layer 30 comprises the word lines 102A and 102B, which are also the gates of the first and second transmission transistors $T_1$ and $T_2$. The first conduction layer 30 also comprises the gates 104A and 104B of the first and second driving transistors $T_3$ and $T_4$.

The second conduction layer comprising the first and second pads 112 and 110, respectively, is formed.

The third conduction layer 50 comprising the ground wire 116 of the memory cell is formed.

The fourth conduction layer 60 comprising third pads 118 for forming a first bit line and the gates 120 of the first and second PMOS TFT $T_5$ and $T_6$ is formed.

The fifth conduction layer 70 comprising the power source line 124 to be at potential $V_{cc}$ is formed. The fifth conduction layer 70 also comprises the channel and drain regions of the first and the second PMOS thin film transistors $T_5$ and $T_6$.

An insulating layer, is formed over the fifth conduction layer 70.

The second bit line is formed in the sixth conduction layer 80.

The PMOS TFT's $T_5$ and $T_6$ of the embodiment described above have a bottom gate structure. An offset region X is formed in the channel regions of the first and second PMOS TFT $T_5$ and $T_6$ of the fifth conduction layer 70. Accordingly, the offset region X of the PMOS TFT's $T_5$ and $T_6$ are formed by the offset between the gate of the PMOS TFT's $T_5$ and $T_6$ formed in the fourth conduction layer 60 and the drain of the PMOS TFT's $T_5$ and $T_6$ formed in the fifth conduction layer 70. The offset region X is over the ground wire 116.

The gates of the NMOS driving transistors $T_3$ and $T_4$ can also be disposed below the offset region X and the ground wire by changing the method for constituting the memory cell. The gates of the NMOS driving transistors $T_3$ and $T_4$ can be disposed beneath the offset region X of the PMOS thin film transistors $T_5$ and $T_6$ if the gates of the NMOS thin film transistors $T_3$ and $T_4$ and the activation region (not shown) are directly connected by a butting method using a conduction layer connected with the drains of the PMOS thin film transistors $T_5$ and $T_6$ and formed using the same material which forms the gates of the PMOS thin film transistors $T_5$ and $T_6$,.

Figure 6:
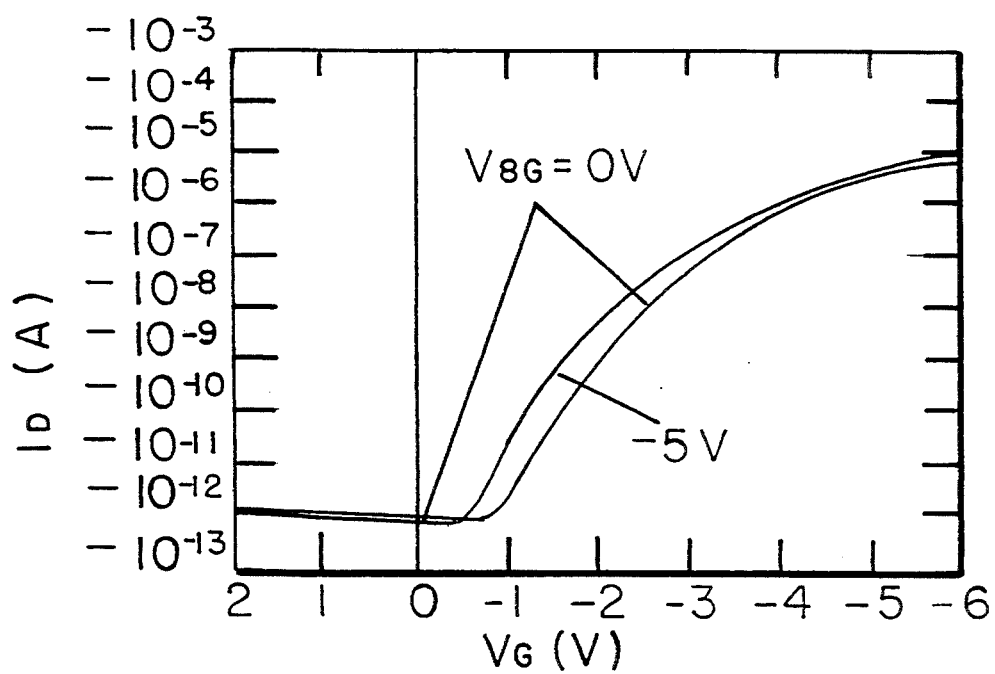
FIG. 6 is a graph showing the relationship of the existence of the conduction layer which operates as a gate for an offset region formed in a PMOS thin film transistor load element according to the present invention.

FIG. 6 is a graphical representation showing the characteristics of the existence of the conduction layer which operates as a gate for the offset regions X of the PMOS TFT's $T_5$ and $T_6$. When the offset regions X are turned ON, a weak accumulation layer (P− layer) is formed in the offset regions X. Therefore, the resistance of the offset region X is decreased and the ON-current is increased. As a result, the electric field in the drain junction decreases thereby decreasing the OFF-current of the SRAM device.

According to the present invention, the offset regions X of the PMOS TFT's $T_5$ and $T_6$ are constantly turned ON by the ground wire which operates as a gate. This has the advantage of enhancing the electrical characteristics of the PMOS TFT's of a memory cell, thereby enhancing the overall characteristics of the SRAM device.

Although the invention has been described in detail with reference to the presently preferred embodiments, it should be understood by one of ordinary skill in the art that various modifications can be made without departing from the spirit and scope of the invention. Accordingly, it is not intended that the invention be limited, except as by the appended claims.

What is claimed is:

1. A semiconductor memory device having a PMOS thin film transistor formed as a load element, wherein said PMOS thin film transistor comprises:
   a source region;
   a channel region adjacent said source region;
   a drain region;

an offset region disposed between said channel region said drain region;

a channel gate substantially aligned with and insulated from said channel region; and an offset gate at least substantially aligned with and insulated from said offset region for reducing a hot carrier effect in said offset region, said offset gate being electrically isolated from said channel gate, and said offset gate being maintainable at a constant potential.

2. A semiconductor memory device according to claim 1, wherein said offset gate at least partially overlaps said channel gate.

3. A semiconductor memory device according to claim 1, wherein said offset region is formed to have an impurity density to be about equal to an impurity density of said channel region.

4. A semiconductor memory device according to claim 1, wherein said offset region is formed to have an impurity density to be between an impurity density of said channel region and an impurity density of said drain region.

5. A semiconductor memory device according to claim 1, wherein said channel gate is formed between said offset gate and said channel region.

6. A semiconductor memory device according to claim 5, wherein said channel gate of said PMOS thin film transistor has a bottom gate structure.

7. A semiconductor memory device according to claim 5, wherein said channel gate of said PMOS thin film transistor has a top gate structure.

8. A semiconductor memory device according to claim 5, wherein said offset gate is comprised of polysilicon and $WSi_x$.

9. A semiconductor memory device according to claim 5, wherein said offset gate is comprised of tungsten silicide.

10. A semiconductor static random access memory device having a PMOS thin film transistor formed as a load element, wherein said PMOS thin film transistor comprises:

a first conductive layer maintainable at a constant potential;

a first insulating layer formed on said first conductive layer;

a gate formed on said first insulating layer;

a second insulating layer formed on said gate; and a second conductive layer formed over said second insulating layer, said second conductive layer comprising:
  i) a source region;
  ii) a channel region adjacent said source region and substantially aligned with and insulated from said gate;
  iii) a drain region;
  ii) an offset region disposed between said channel region and said drain region, said offset region being substantially aligned with a portion of and insulated from said first conductive layer;

wherein said first conductive layer operates as an offset region gate to reduce a hot carrier effect in said offset region.

11. A semiconductor static random access memory device having a PMOS thin film transistor formed as a load element according to claim 10, wherein said first conductive layer is maintainable at a ground potential.

12. A semiconductor static random access memory device having a PMOS thin film transistor formed as a load element according to claim 10, wherein said first conductive layer is electrically isolated from said gate.

13. A semiconductor static random access memory device having a PMOS thin film transistor formed as a load element, wherein said PMOS thin film transistor comprises:

a first conductive layer maintainable at a constant potential;

a first insulating layer formed on said first conductive layer;

a gate formed on said first insulating layer;

a second insulating layer formed on said gate; and a second conductive layer formed over said second insulating layer;

wherein said first conductive layer operates as an offset region gate to reduce a hot carrier effect in said offset region.

14. A semiconductor static random access memory device having a PMOS thin film transistor formed as a load element according to claim 13, wherein said first conductive layer is maintainable at a ground potential.

15. A semiconductor static random access memory device having a PMOS thin film transistor formed as a load element according to claim 13, wherein said first conductive layer is electrically isolated from said gate.

16. A semiconductor memory device according to claim 1, wherein said offset gate is maintainable at a ground potential.

* * * * *